United States Patent [19]

Inoue

[11] Patent Number: 5,559,048
[45] Date of Patent: Sep. 24, 1996

[54] METHOD OF MAKING A DOUBLE LAYERED FLOATING GATE EPROM WITH TRENCH ISOLATION

[75] Inventor: Tatsuro Inoue, Tokyo, Japan

[73] Assignee: NEC Corporation, Tokyo, Japan

[21] Appl. No.: 343,899

[22] Filed: Nov. 17, 1994

[30] Foreign Application Priority Data

Nov. 17, 1993 [JP] Japan ................... 5-311304

[51] Int. Cl.⁶ .............................................. H01L 21/8247
[52] U.S. Cl. .............................. 437/43; 437/67; 437/984; 437/191; 257/316
[58] Field of Search ......................... 437/43, 48, 52, 437/67, 191, 984; 257/316

[56] References Cited

U.S. PATENT DOCUMENTS 5,173,436  12/1992  Gill et al. ................. 437/43
5,208,179   5/1993  Okazawa .................. 437/52
5,229,316   7/1993  Lee et al. ................ 437/67
5,352,619  10/1994  Hong ...................... 437/43
5,413,946   5/1995  Hong ...................... 437/35

Primary Examiner—George Fourson
Assistant Examiner—Richard A. Booth
Attorney, Agent, or Firm—Young & Thompson

[57] ABSTRACT

The present invention provides a novel double-layered floating gate memory transistor wherein drain and source regions are self-aligned with respect to a first floating gate layer and isolations regions that isolate the memory cell regions on which the memory transistors are formed are also self-aligned but with respect to a second floating gate layer overlying the first floating gate layer.

5 Claims, 12 Drawing Sheets

5,559,048

METHOD OF MAKING A DOUBLE LAYERED FLOATING GATE EPROM WITH TRENCH ISOLATION

BACKGROUND OF THE INVENTION

1. Field of the Invention

The invention relates to a semiconductor non-volatile memory device, and more particularly to an improvement in an erasable and programmable read only memory device with a double-layered floating gate structure and a method for fabricating the same.

2. Description of the Related Art

Recently, developments of the erasable and programmable read only memory device with the double-layered floating gate structure and a flash memory device have been successful increasingly. The double-layered floating gate erasable and programmable read only memory device is classified in the group of the non-volatile memory device in which Fowler-Nordheim tunneling is utilized to accomplish the programming and erasure of data. One of the non-volatile memory devices utilizing the Fowler-Nordheim tunneling for programming and erasure of data is disclosed in 1992 IEDM Technical Digest pp. 991–993, H. Kume et al. in which a structure of the memory device is improved in a cell area by use of contactless cell array technique.

FIG. 1 is a conventional circuit configuration of the memory arrays The conventional memory arrays comprise a lateral alignment of a plurality of NOR memory cell array blocks "NOR". A plurality of global data lines D0, D1, . . . Dn run on the memory arrays in parallel to a longitudinal direction of the NOR memory cell array blocks "NOR". A plurality of word lines W0, W1, . . . , Wm run on the memory arrays in a vertical direction to the global data lines. First and second selective lines ST1 and ST2 run on the memory arrays in parallel to the word lines. Further, a common source line S runs on the memory arrays in a parallel direction to the word lines. Furthermore, first and second selective lines ST1 and ST2 also run on the memory arrays in a parallel direction to the word lines. Each of the NOR memory cell array blocks includes a plurality of double-layered floating gate memory transistors $Q_{Mij}$ serving as the erasable and programmable read only memory device. Each of the NOR memory cell array blocks further includes a pair of a local data line Ldn and a local source line Lsn. Each of the double-layered floating gate memory transistors $Q_{Mij}$ is provided between the local data line Ldn and the local source line Lsn wherein the local data line is connected to the drain side of each of the double-layered floating gate memory transistors $Q_{Mij}$, while the local source line is connected to the source side of each of the double-layered floating gate memory transistors $Q_{Mij}$. Each of the double-layered floating gate memory transistors $Q_{Mij}$ has both a control gate and the double-layered floating gate wherein the control gate is connected to the word line to receive control signals being transmitted on the word line and the floating gate stores a signal charge as data therein. The local data line is connected through a first selective transistor Qsn1 to the global data line Dn. The local source line is connected to a second selective transistor Qsn2 to the common source line S. The first and second selective transistors are provided in each of the NOR memory array blocks. The gates of the first and second selective transistors Qsn1 and Qsn2 are connected to the first and second selective lines ST1 and ST2 respectively.

FIG. 2 is a fragmentary plane view illustrative of the adjacent two NOR memory cell array blocks. FIGS. 3A and 3B are fragmentary cross sectional elevation views illustrative of the adjacent two NOR memory cell array blocks taken along A–A' line and B–B' line.

The NOR memory cell array blocks including the double-layered floating gate memory transistors is formed on a semiconductor substrate 201. Each of the double-layered floating gate memory transistors provided in a cell area surrounded by field oxide films 214 and isolation impurity diffusion regions 211a, 211b, 211c and 211d. The field oxide films 214 extend in parallel to the longitudinal direction of the NOR memory cell array blocks to isolate the adjacent two NOR memory cell array blocks from each other, while the isolation impurity diffusion region 211a, 211b, 211c and 211d extend in parallel to the word lines to isolate the double-layered floating gate memory transistors involved in each the NOR memory cell array blocks from each other. The double-layered floating gate memory transistors have source and drain regions 204a, 204b, 204c and 204d formed in upper regions of the semiconductor substrate 201. A gate oxide film 202 is provided on the semiconductor substrate 201 in a predetermined area defined by the field oxide films 214 to extend over the source and drain regions and the isolation impurity diffusion regions. First floating gates 203a, 203b, 203c and 203d are provided through the gate oxide film 202 over channel regions define by the source and drain regions and the isolation impurity diffusion regions. The first floating gates 203a, 203b, 203c and 203d are surrounded by a first inter-layer insulator 205. Second floating gates 206a, 206b, 206c and 206d extend on the first floating gates 203a, 203b, 203c and 203d and further extend in the parallel direction to the word lines on the first inter-layer insulator 205. The first and second floating gates are in contact with each other to form a double-layered floating gate structure. A second gate oxide film 209 is provided on the second floating gate and further extends in the parallel direction to the word lines. A control gate 210 is provided on the second gate oxide film 209 to extend in the parallel direction to the word lines. A second inter-layer insulator 212 is provided on an entire region to cover the control gate 210 and also to isolate individual gate structures comprising the control gate and the double-layered floating gates from each other in parallel to the data lines. Metal wirings 213 are provided on the second inter-layer insulator 212 in the longitudinal direction of the NOR memory cell array blocks. The metal wirings 213 may serve as the data lines. In FIG. 2, a filed pattern 220 is defined by the field oxide film 214.

The first gate oxide film 202 is very thin, for example, 100 angstroms and further the second floating gate 206 extends beyond the area of the first floating gate 203 to have a larger contact area than a contact area of the first floating gate 203 so that a capacitance between the control gate 210 and the second floating gate 206 is larger than a capacitance between the first floating gate 203 and the semiconductor substrate 201. This structure may permit that a Fowler-Nordheim tunneling between the first floating gate 203 and either the source or drain regions is caused by applying the control gate 210 with a relatively low voltage, for example, 3 V. The Fowler-Nordheim tunneling between the first floating gate 203 and either the source or drain regions may be utilized for data erasure and programming.

The description will focus on operations of the memory devices with reference back to FIG. 1, provided that each of the double-layered floating gate memory transistors is an n-channel transistor. The following Table 1 describes a relationship of selections of the double-layered floating gate memory transistors and voltages of any lines involved in the memory arrays, for example, voltages of the first and second selective lines ST1 and ST2, the word lines W0, W1, W2 and Wm, the global data line D0, the local data line Ld0, the local source line Ls0 and the common source line S.

Operations in the data writing mode or the programming mode will be described. When a data writing or programming to the memory transistor $Q_{M00}$ is required, the voltage of the global data line D0 is set at 3 V. The first selective line

TABLE 1

| Mode | Erase | Write | | | | Read | | | |
|---|---|---|---|---|---|---|---|---|---|
| Tr | — | $Q_{M00}$ | $Q_{M01}$ | $Q_{M02}$ | $Q_{M0m}$ | $Q_{M00}$ | $Q_{M01}$ | $Q_{M02}$ | $Q_{M0m}$ |
| ST1 | 3 | 3 | | | | 3 | | | |
| W0 | 13 | −9 | 3 | 3 | 3 | 3 | 0 | 0 | 0 |
| W1 | 13 | 3 | −9 | 3 | 3 | 0 | 3 | 0 | 0 |
| W2 | 13 | 3 | 3 | −9 | 3 | 0 | 0 | 3 | 0 |
| Wm | 13 | 3 | 3 | 3 | −9 | 0 | 0 | 0 | 3 |
| D0 | 0 | 3 | | | | 1 | | | |
| Ld0 | 0 | 3 | | | | 1 | | | |
| Ls0 | 0 | floating | | | | 1 | | | |
| ST2 | 3 | 0 | | | | 3 | | | |
| S | 0 | 0 | | | | 0 | | | |

(Unit : V)

The data erasure is accomplished by injection of electrons into the floating gate, while the data programming or write operation is accomplished by extraction of electrons from the floating gate.

The following descriptions will be concerned with the mode of data erasure of the memory transistors $Q_{M00}$, $Q_{M01}$, $Q_{M02}$ and $Q_{M0m}$. When a data erasure of the memory transistor $Q_{00}$ is required, a voltage of the global data line D0 is set at 0 V and a voltage of the first selective line ST1 is set at 3 V thereby the first selective transistor $Q_{s01}$ turns ON. During this mode, a voltage of the global data line D0 is kept at 0 V so that the 0 V of the global data line D0 is applied on the local data line $L_{Dn}$. A voltage of the second selective line ST2 is set at 3 V thereby the second selective transistor $Q_{s02}$ turns ON. During this mode, a voltage of the common source line S is also held at 0 V so that the 0 V of the common source line S is applied on the local source line $L_{sn}$. In this meantime, all of the word lines involved in the memory arrays are applied with a high voltage, for example, 13 V. That is why the control gate of each of the memory transistors involved in the memory arrays receives the high voltage of 13 V. The first gate oxide film 202 is designed to be thinner than the second gate oxide film 209 so that a relatively high electric filed is caused in the first gate oxide film 202 between the double-layered floating gate structure and the semiconductor substrate 201. The electric filed caused in the first gate oxide film 202 is sufficiently high to cause a Fowler-Nordheim tunneling that may inject electrons in the channel region through the first gate oxide film 202 to the first floating gate 203 as illustrated in FIGS. 4B and 5. The electron injection into the first floating gate, that was caused by the Fowler-Nordheim tunneling, results in an increase of a threshold voltage of the individual memory transistor. The injection of the electrons into the first floating gate may complete the data erasure of the memory transistor.

When it is required to store the data in the memory transistor without erasure of the data, the word line is applied with a 0 V.

Consequently, when the data erasure of the memory transistor is required, the local source and drain lines are applied with 0 V to render the source and drain regions of the transistor have 0 V and further a high voltage such as 13 V is applied to the control gate of the memory transistor to case the Fowler-Nordheim tunneling that cause the electron injection from the channel region through the first gate oxide film into the first floating gate.

ST1 is also set at a voltage of 3 V to have the first selective transistor turn ON to thereby permit the voltage of 3 V on the global data line to be applied on the local data line. By contrast, the common source line is set at a voltage of 0 V to have the second selective transistor turn OFF to thereby place the local source line in the floating state. Under the above states, the word lines are set at a negative voltage, for example, −9 V That is why the control gate of each of the memory transistors involved in the memory arrays receives the negative voltage of −9 V. The first gate oxide film 202 is thinner than the second gate oxide film 209 so that a relatively high electric filed is caused in the first gate oxide film 202 between the double-layered floating gate structure and the semiconductor substrate 201. The electric filed caused in the first gate oxide film 202 is sufficiently high to cause a Fowler-Nordheim tunneling that may extract electrons from the first floating gate to have the extracted electrons be injected through the first gate oxide film 202 into the drain region of the memory transistor as illustrated in FIGS. 4A and 5. The electron extraction from the first floating gate, that was caused by the Fowler-Nordheim tunneling, results in a drop of the threshold voltage of the individual memory transistor. The extraction of the electrons from the first floating gate may complete the data writing or programming of the memory transistor.

When it is required to store the data in the memory transistor without writing of the data, the word line is set at the positive voltage, for example, 3 V.

Consequently, when the data writing or the programming of the memory transistor is required, the local source region is made into the floating state and the drain region is set at the voltage of 3 V and further a negative voltage such as −9 V is applied to the control gate of the memory transistor to case the Fowler-Nordheim tunneling that causes the electron extraction from the floating gate through the first gate oxide film into the drain region.

Operations in mode of reading the data already stored in each of the memory transistors $Q_{M00}$, $Q_{M01}$, $Q_{M02}$ and $Q_{M0m}$ will subsequently described. When a read operation of the data from the memory transistor $Q_{M00}$, then the global data line D0 is set at a voltage of 1 V and the first selective line ST1 is set at 3 V and also the second selective line is set at a voltage of 3 V. The common source line S is set at a voltage of 0 V. As a result, the first and second memory transistors turn ON thereby the local data line is applied with the voltage of 1 V and the local source line is applied with a voltage of 0 V. The word line W0 being connected to the control gate of the memory transistor $Q_{M00}$, from which the stored data should be red out, is set at a voltage of 3 V, while the remaining word lines W1, W2 and Wm being not connected to the control gate of the memory transistor $Q_{M00}$ are set at a voltage of 0 V.

Under the above state, if the memory transistor $Q_{M00}$ is in the erasure state, then electrons exist in the floating gate thereby the threshold voltage is higher than the voltage applied on the word line connected to the control gate of the memory transistor. This results in no current from the global data line to the common source line.

By contrast, if the memory transistor $Q_{M00}$ is in the data writing or programming state, then no electron exist in the floating gate thereby the threshold voltage is lower than the voltage applied on the word line connected to the control gate of the memory transistor. This results in a current flow from the global data line to the common source line.

The description will focus on the bias states both in the data erasure mode and in the data programming mode. The following Table 2 describes voltages of the first and second selective lines ST1 and ST2, the word line W0, the global data lines D0 and D1, the local data lines Ld0 and Ld1, the local source lines Ls0 and Ls1 and the common source line S.

TABLE 2

| Mode | Erase | Write | |
|------|-------|-------|-------|
| Tr | — | $Q_{M00}$ | $Q_{M10}$ |
| ST1 | 3 | 3 | |
| W0 | 13 | −9 | |
| D0 | 0 | 3 | 0 |
| D1 | 0 | 0 | 3 |
| Ld0 | 0 | 3 | 0 |
| Ld1 | 0 | 0 | 3 |
| Ls0 | 0 | floating | floating |
| Ls1 | 0 | floating | floating |
| ST2 | 3 | 0 | |
| S | 0 | 0 | |

(Unit : V)

The control gates of the memory transistors $Q_{M00}$ and $Q_{M10}$ are connected to the word line W0, for that reason the erasure mode is free from any selectivity of the memory transistors, but in the write mode a selective writing operation is carried out by voltage controls of the local data lines Ld0 and Ld1.

The following descriptions are concerned with operations when writing the data into the memory transistor $Q_{M00}$ only, but not writing any data into the memory transistor $Q_{M10}$. The memory transistor $Q_{M00}$ only comes into a bias state, while due to no writing operation of the memory transistor $Q_{M10}$, the global data line is set at a voltage of 0 V to make the local data line have the voltage of 0 V. When the memory transistor $Q_{M00}$ is in the bias state, the control gate of the memory transistor $Q_{M00}$ is applied with a negative voltage of 9 V and the drain thereof receives a positive voltage of 3 V. By contrast, the drain of the memory transistor $Q_{M10}$ is applied with a zero voltage. Then, the memory transistor $Q_{M10}$ has a low electric field between the control gate and the drain region than an electric field between those of the memory transistor $Q_{M00}$. That is why the memory transistor $Q_{M10}$ has no appearance of the Fowler-Nordheim tunneling, even while the memory transistor $Q_{M00}$ shows the Fowler-Nordheim tunneling. No appearance of the Fowler-Nordheim tunneling may prevent any writing operation.

From the above descriptions, it could be understood that the conventional memory transistor utilizes the Fowler-Nordheim tunneling for data programming and data erasure operation. In the conventional memory transistor, the plural memory transistors are connected through those drains to a single local data line that is further connected through the first selective transistor to the global data line as well as the memory transistors are connected through those sources to a single local source line that is further connected through the seond selective transistor to the common source line. The plural memory transistors and the first and second selective transistors may constitute a single NOR memory cell array block. The memory transistors connected to one of the word lines are separated through the field oxide films from each other. The isolation by the field oxide film of the memory cell array blocks may raise a problem with a generation of a bird's beak in the fabrication process. The bird's beak provides an enlargement of the isolation region thereby resulting in a reduction of the cell size in the parallel direction to the word lines.

A method for settling the above problem with the bird's beak was proposed and disclosed in the Japanese laid-open patent application No. 2-87677. The method will be described with reference to FIGS. 6A to 6F.

With reference to FIG. 6A, a semiconductor substrate 301 is prepared before a filed oxide film 314 and a first gate oxide film 302 are formed on a surface of the semiconductor substrate 301 wherein the first gate oxide film is formed on a memory cell region. A floating gate is formed by use of patterning in the memory cell region on the first gate oxide film 302.

With reference to FIG. 6B, a photo resist mask 316 is formed by patterning on a surface of the device except for an isolation region for isolating memory cell regions from each other.

With reference to FIG. 6C, the floating gate 315, the first gate oxide film 302 and the semiconductor substrate 301 are sequentially removed by etching with use of the photo resist pattern as a mask to form isolation trench grooves 307, after that the used photo-resist mask are removed from the semiconductor substrate 301.

With reference to FIG. 6D, a thermal oxidation is carried out so that a second gate oxide film 309 is formed over the floating gate 315 and a side wall isolation film is formed on side walls and a bottom of the isolation trench groove as well as a gate oxide film is formed on a peripheral transistor region. An isolation film is deposited by a chemical vapor deposition within the trench grooves for subsequent etch-back process to fill the trench grooves with a trench groove isolation film 308.

With reference to FIG. 6E, a control gate 310 comprising a polysilicon film is formed and then receive a thermal oxidation so that a thin isolation film 317 is formed to cover the control gate 310.

With reference to FIG. 6F, diffusion regions 304 are formed in an upper region of the semiconductor substrate 301 in the peripheral transistor region. Other diffusion regions not illustrated are also formed in an upper region of the semiconductor substrate 301 but in the memory transistor region. Further, an inter-layer insulator 318 is formed on the surface of the device, after which metal wirings 313 are formed on the inter-layer insulator 318.

Consequently, that prior art utilizes the isolation trench groove to isolate the memory cell transistors from each other and also utilizes the self-alignment technique of the channel regions of the memory cell transistors by defining the trench isolation. Notwithstanding, that prior art is not applicable to the fabrication processes of the double-layered floating gate memory transistor. If that prior art is applied to the fabrication processes of the double-layered floating gate memory transistor, then the isolation region extends to the source and drain regions of the memory transistors so the required source and drain regions are not formed. Then, the double-layered floating gate memory transistors formed by the conventional method as disclosed in the Japanese laid-open patent application No. 2-87677 could not be operational. Consequently, any prior arts that has been known in the art could not settle the problems with the enlargement of the isolations regions that renders the cell region small.

SUMMARY OF THE INVENTION

Accordingly, it is a primary object of the present invention to provide a novel method for fabricating a floating gate memory cell transistor free from any problems as described above.

It is a further object of the present invention to provide a novel floating gate memory cell transistor free from any problems as described above.

The above and other objects, features and advantages of the present invention will be apparent form the following descriptions.

The present invention provides a novel method for fabricating a double-layered floating gate memory transistor wherein drain and source regions are self-aligned with respect to a first floating gate layer and isolations regions that isolate the memory cell regions on which the memory transistors are formed are also self-aligned but with respect to a second floating gate layer overlying the first floating gate layer.

According to the present invention, the drain and source regions are self-aligned with respect to the first floating gate layer and isolations regions that isolate the memory cell regions on which the memory transistors are formed are also self-aligned but with respect to the second floating gate layer overlying the first floating gate layer. This novel fabrication method is free from the problem with the appearance of the bird's beak, namely free from any enlargement of the isolation region. No enlargement of the isolation region may permit an improvement of the memory transistor arrays in a degree of integration thereof.

BRIEF DESCRIPTIONS OF THE DRAWINGS

Preferred embodiments of the present invention will hereinafter fully be described in detail with reference to the accompanying drawings.

DESCRIPTION OF THE PREFERRED EMBODIMENTS

A preferred embodiment of the present invention will be described in detail with reference to the drawings.

The present invention provides a novel double-layered floating gate memory transistor wherein drain and source regions are self-aligned with respect to a first floating gate layer and isolations regions that isolate the memory cell regions on which the memory transistors are formed are also self-aligned but with respect to a second floating gate layer overlying the first floating gate layer.

The present invention also provides a novel method for fabricating the novel double-layered memory transistors as described above. The novel method will be described in detail.

Figure 9A:
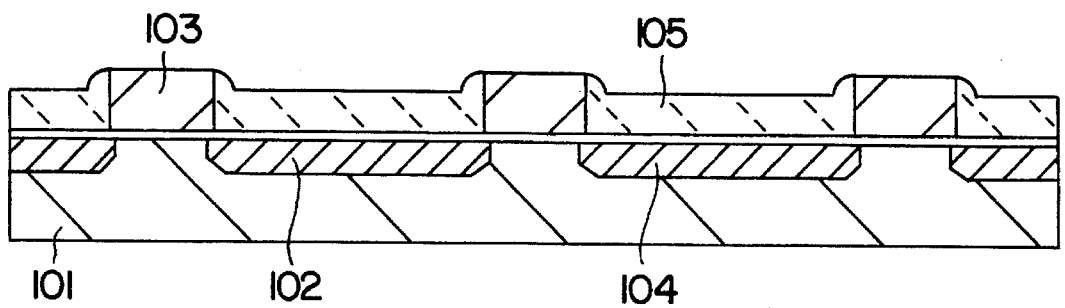
FIGS. 9A to 9H are fragmentary cross sectional elevation views illustrative of a novel method for fabricating the memory transistor arrays.

With reference to FIG. 9A, a semiconductor substrate 101 of a p-type is prepared to expose a surface of the semiconductor substrate 101 to a thermal oxidation so that a first gate oxide film 102 is formed thereon. The first gate oxide film has a thickness of 100 angstroms. A polysilicon film doped with an n-type impurity is grown by a chemical vapor deposition on the first gate oxide film 102 until the deposited polysilicon film has a thickness of 4000 angstroms. The polysilicon film is subsequently etched by a first floating gate pattern to form a first floating gate 103. An impurity of an n-type is introduced at $5\times10^{15}$ (cm$^{-2}$) into an upper region of the semiconductor substrate 101 by use of the first floating gate 103 as a mask to form diffusion regions 104 that may serve as source and drain regions of a memory transistor. A first inter-layer insulator 105 having a thickness of 8000 angstroms is grown by a chemical vapor deposition on an entire surface of the device for subsequent etchback process to fill apertures between the first floating gates 103 with the first inter-layer insulator 105.

Figure 9B:
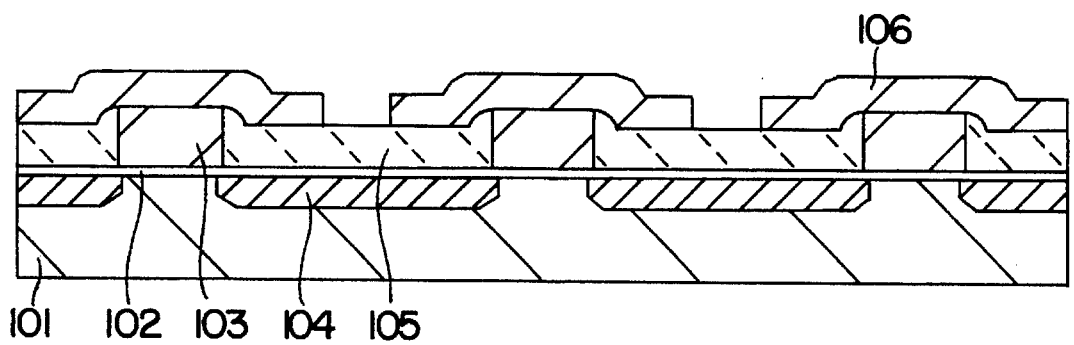

With reference to FIG. 9B, a polysilicon film doped with an n-type impurity and having a thickness of 2000 angstroms is grown by a chemical vapor deposition on an entire surface of the device. Thereafter, the deposited polysilicon is etched by use of a second floating gate pattern as a mask to form a second floating gate 106.

Figure 9C:
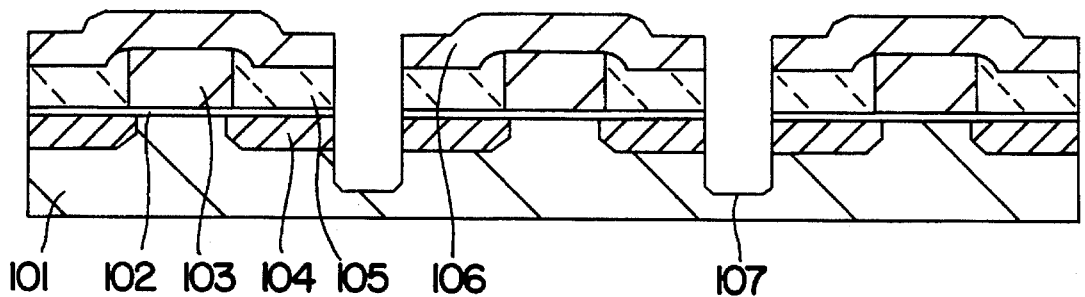

With reference to FIG. 9C, the first inter-layer insulator 105, the diffusion regions 104 serving as the source and drain regions and an upper portion of the semiconductor substrate 101 are sequentially etched by use of the second floating gate 106 as a mask to form by self-alignment technique isolation trench grooves 107 that isolate memory cell regions from each other. The isolation trench groove is required to have at least a larger depth than a depth of the diffusion regions 104 formed in the upper regions of the semiconductor substrate 101. The depth of the isolation trench groove may for example be 2 micrometers.

Figure 9D:
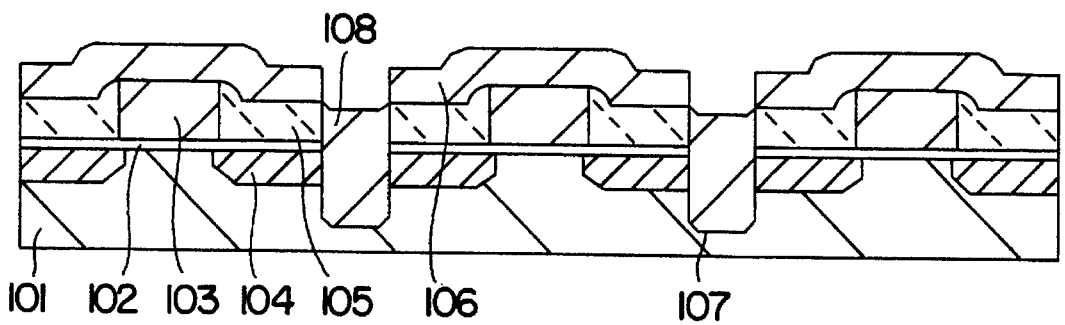

With reference to FIG. 9D, a trench groove isolation film 108 having a thickness of 5000 angstroms is deposited by a chemical vapor deposition to be subjected to an etchback process to fill the isolation trench groove 107 with the trench groove isolation film 108.

Figure 1:
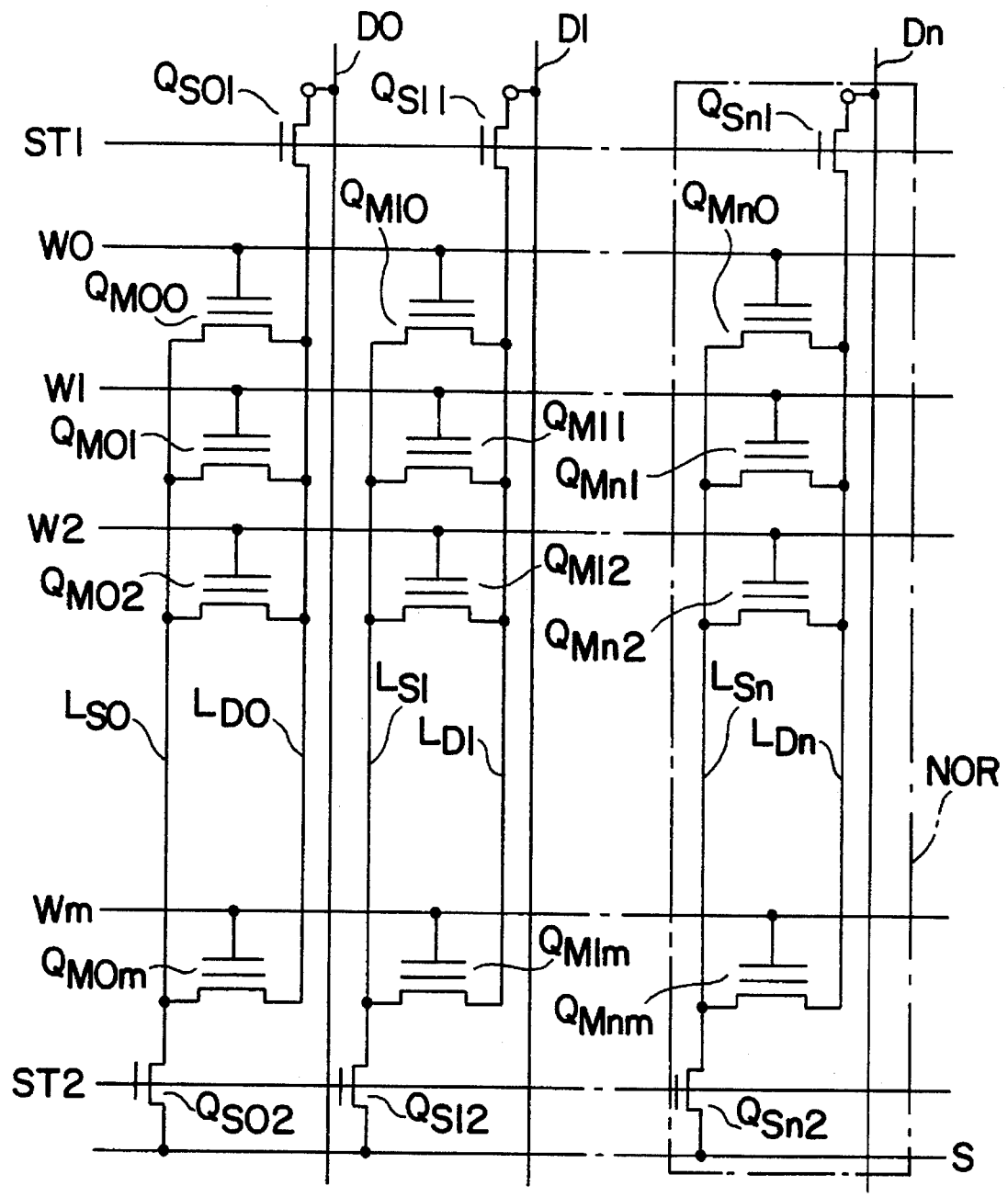
FIG. 1 is a circuit diagram illustrative of the conventional memory transistor arrays.
Figure 2:
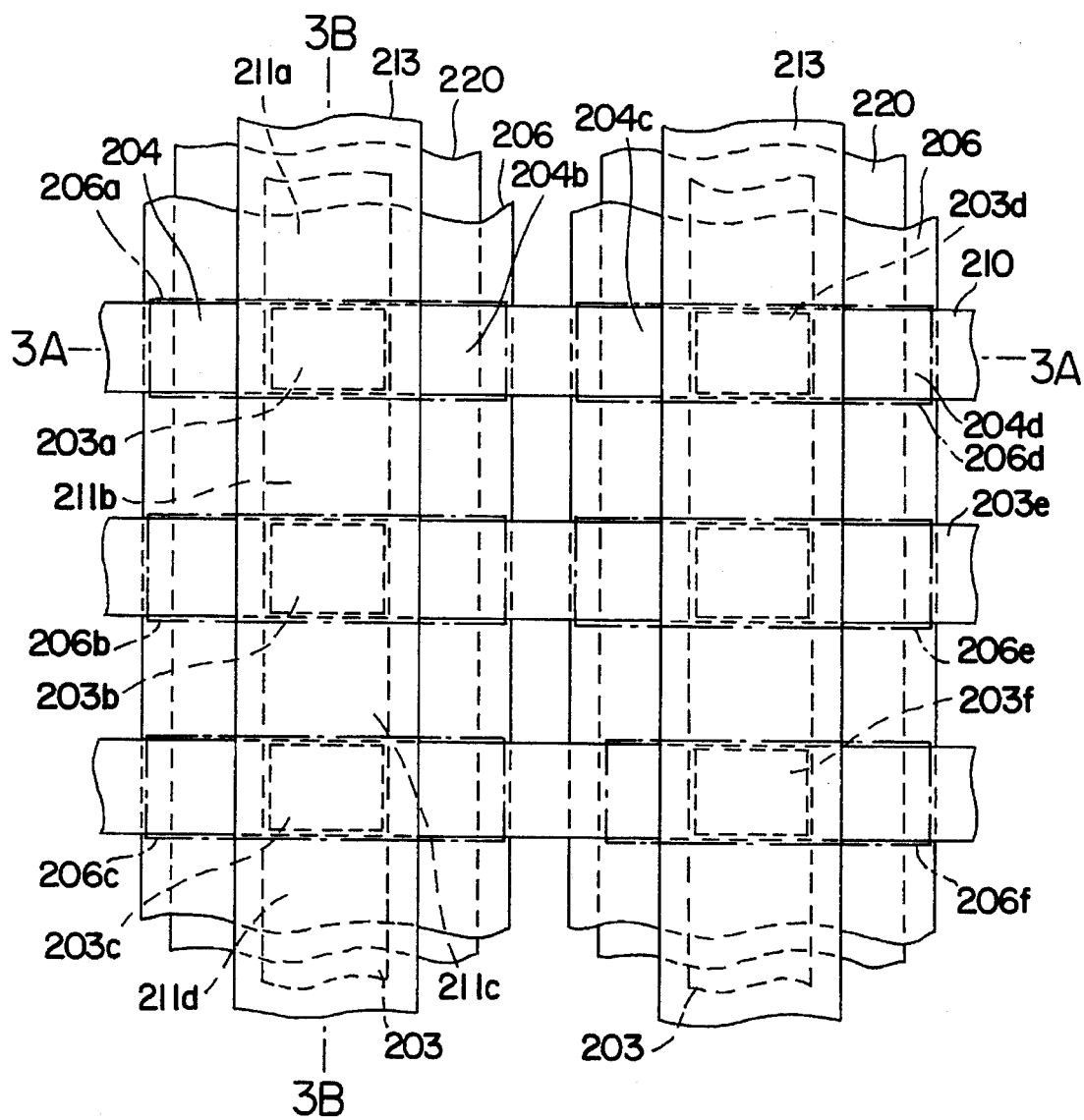
FIG. 2 is a fragmentary plane view illustrative of the conventional memory transistor arrays.
Figure 3A:
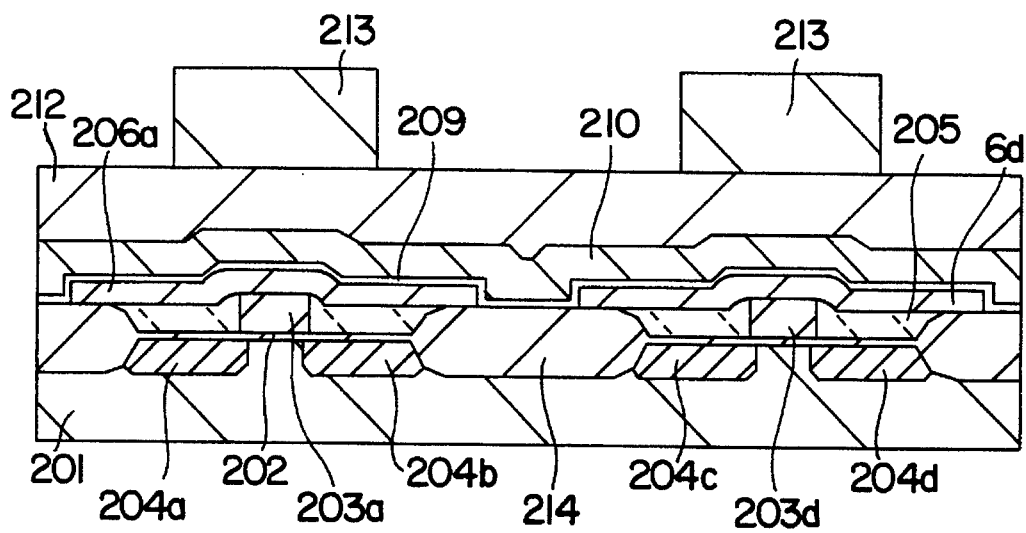
FIG. 3A is a fragmentary cross sectional elevation view illustrative of the conventional memory transistor arrays of FIG. 2 taken along the A–A' line.
Figure 3B:
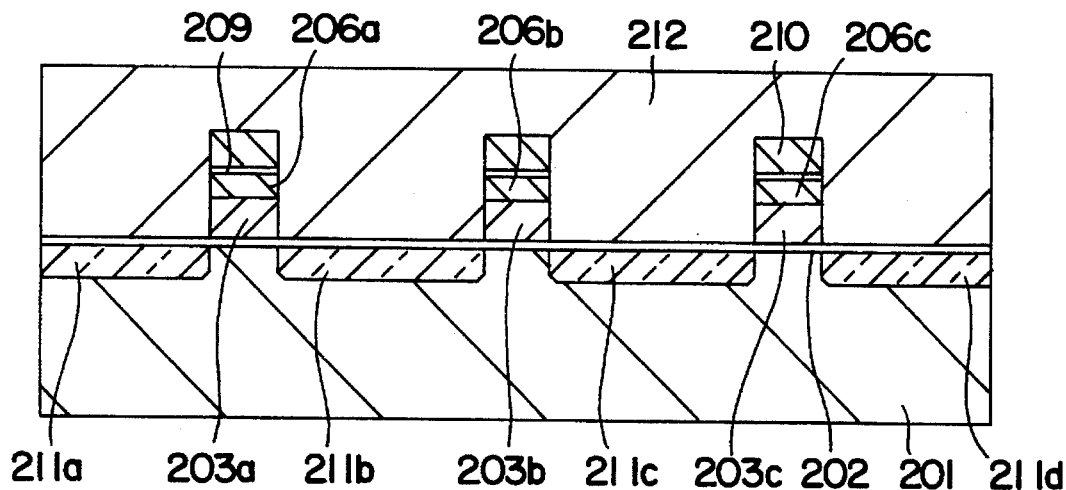
FIG. 3B is a fragmentary cross sectional elevation view illustrative of the conventional memory transistor arrays of FIG. 2 taken along the B–B' line.
Figure 4A:
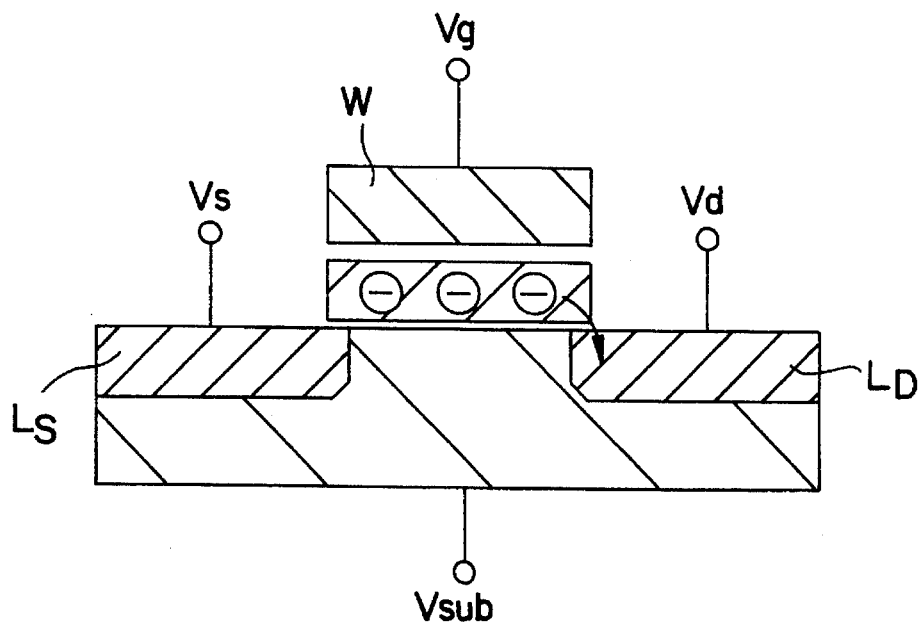
FIG. 4A is a cross sectional elevation view illustrative of a memory transistor in a data writing operation mode.
Figure 4B:
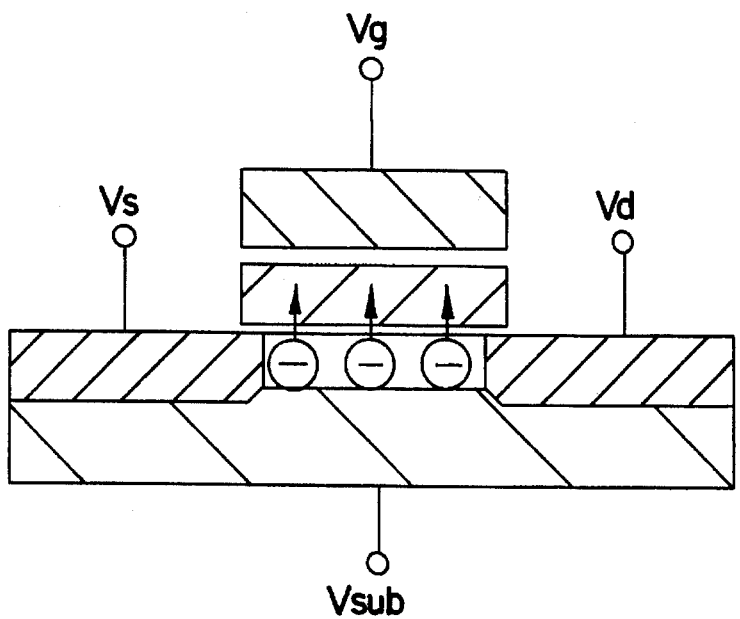
FIG. 4B is a cross sectional elevation view illustrative of a memory transistor in a data erasure operation mode.
Figure 5:
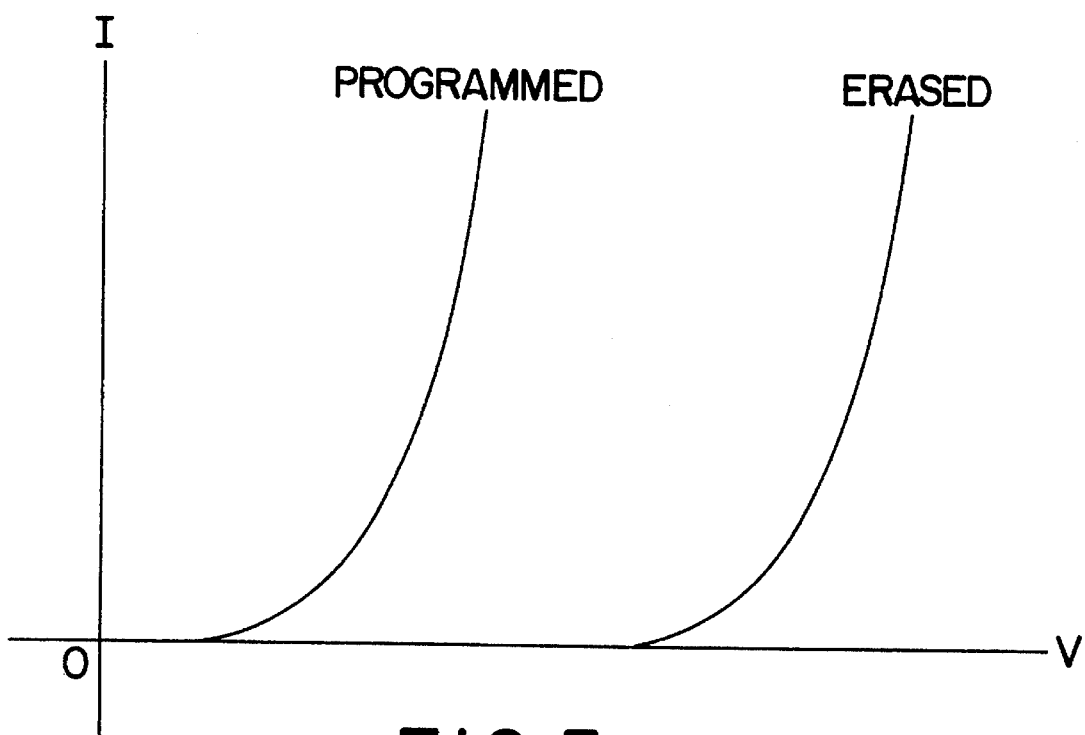
FIG. 5 is a view illustrative of a voltage-current characteristic of a memory cell transistor in both the data writing and erasure modes.
Figure 6A:
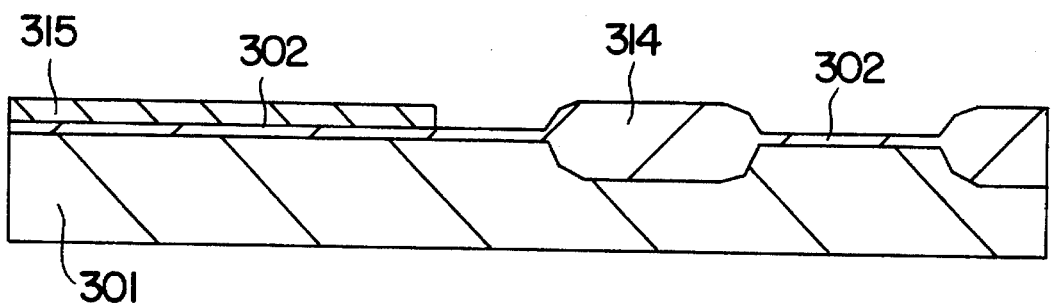
FIGS. 6A to 6F are fragmentary cross sectional elevation views illustrative of the novel method for fabricating the memory transistor arrays.
Figure 6B:
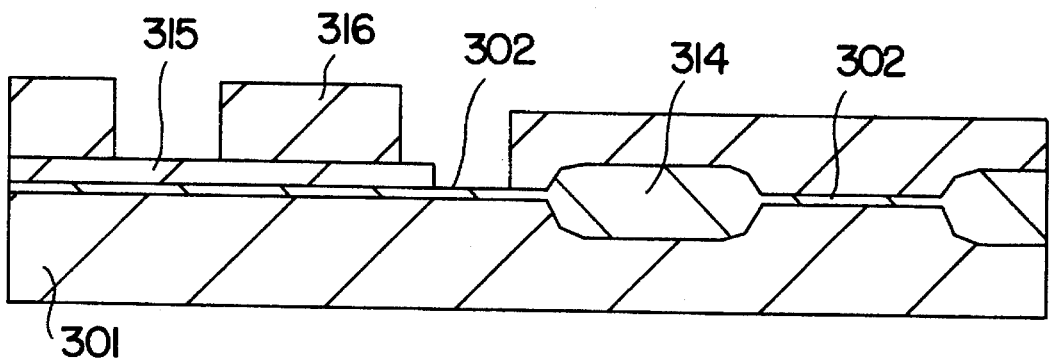
Figure 6C:
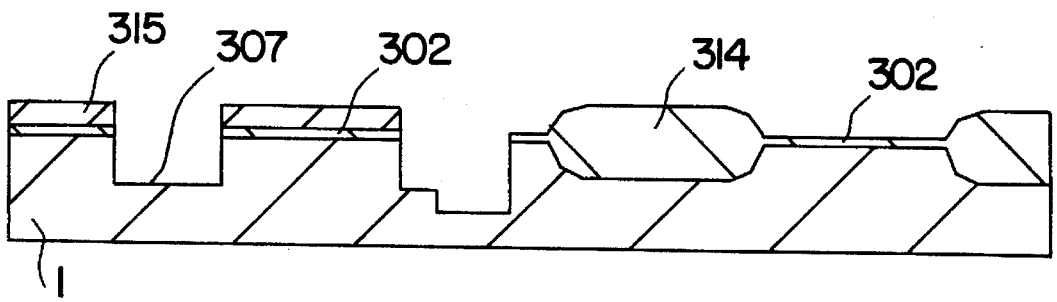
Figure 6D:
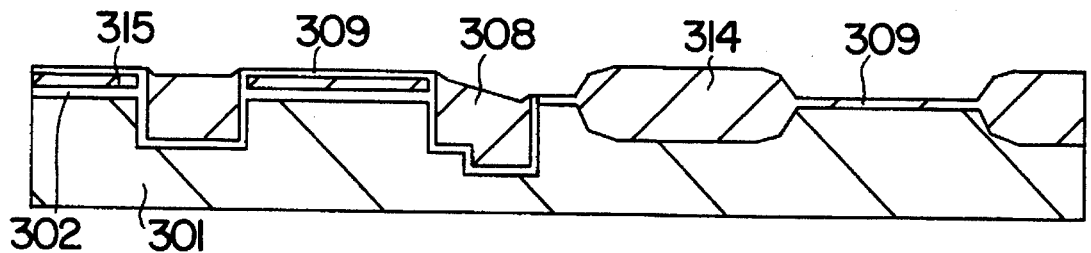
Figure 6E:
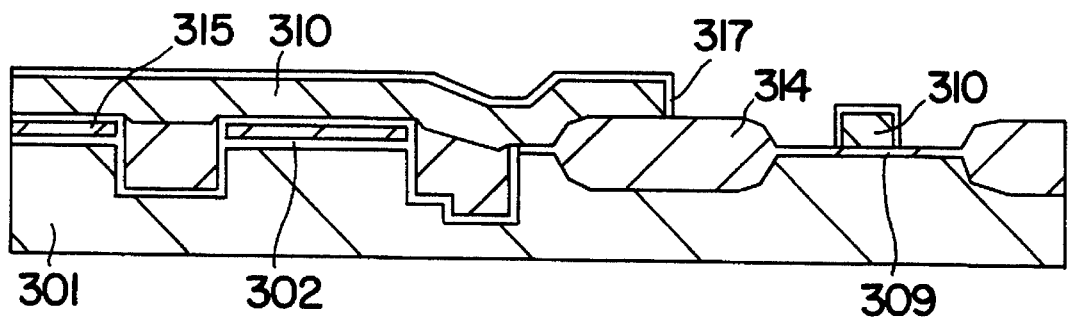
Figure 6F:
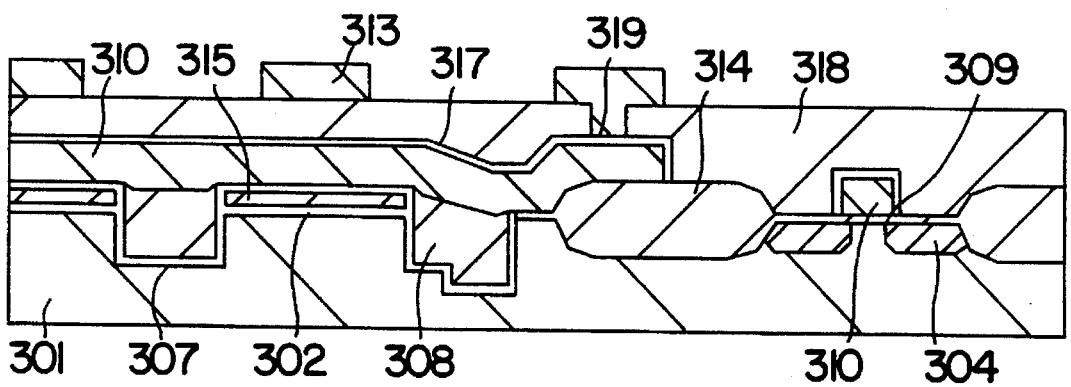
Figure 7:
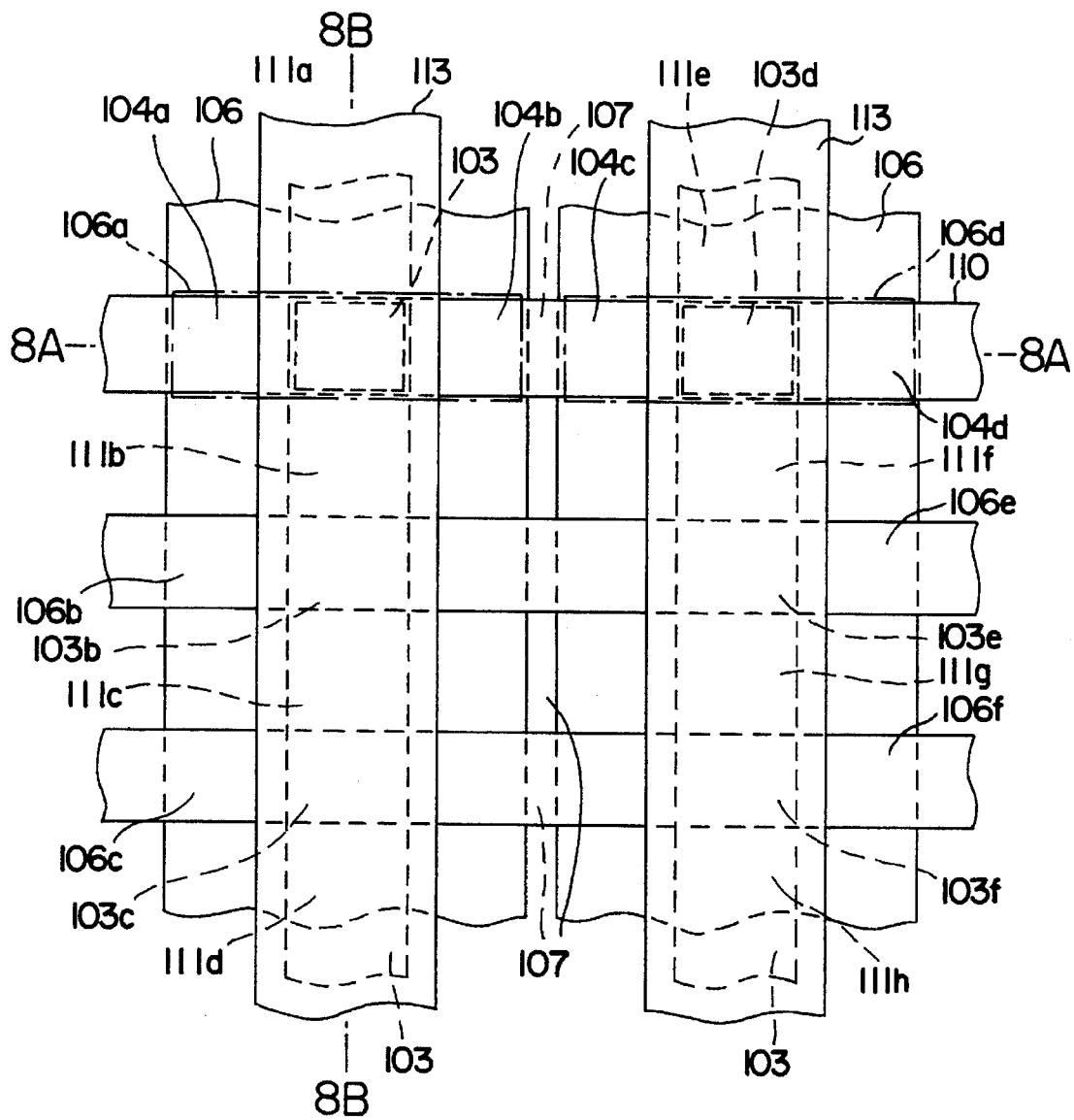
FIG. 7 is a fragmentary plane view illustrative of novel memory transistor arrays.
Figure 8A:
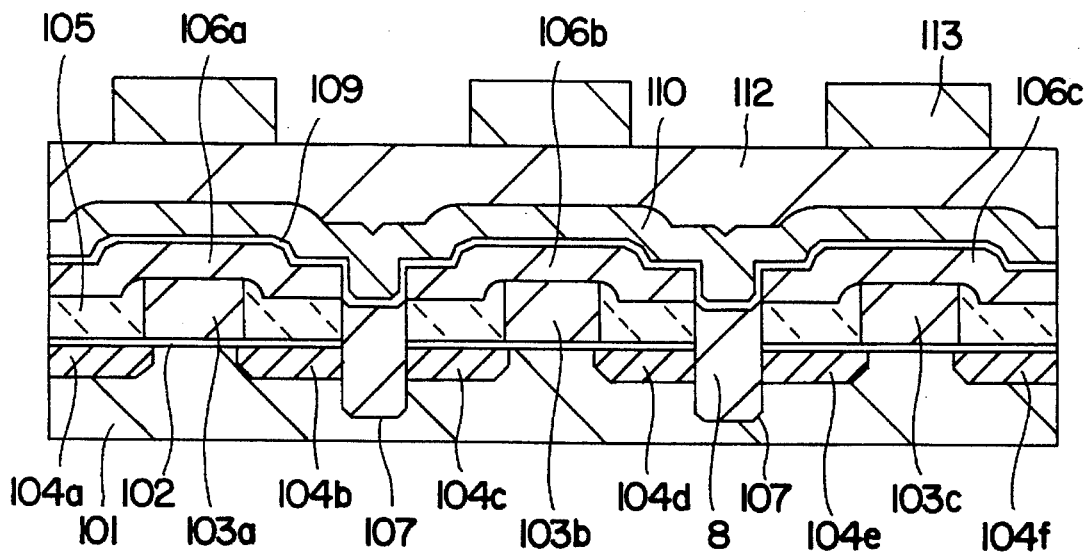
FIG. 8A is a fragmentary cross sectional elevation view illustrative of novel memory transistor arrays of FIG. 7 taken along the A–A' line.
Figure 8B:
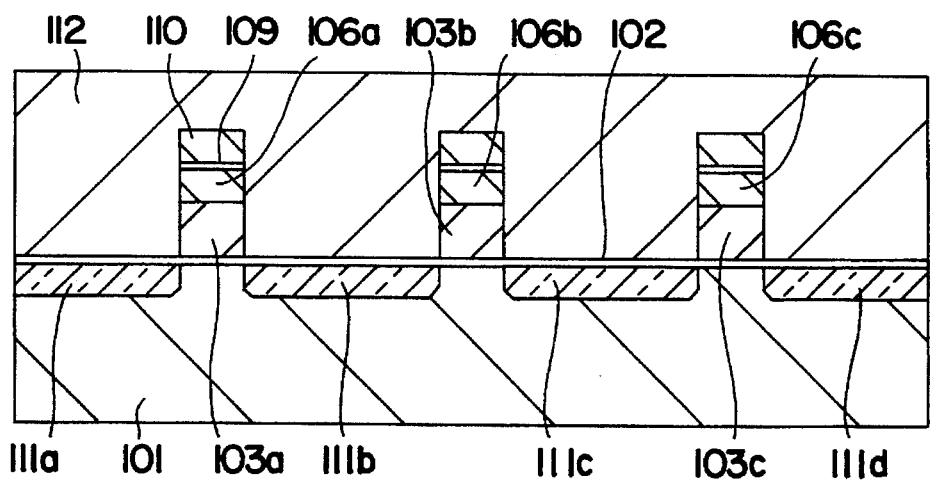
FIG. 8B is a fragmentary cross sectional elevation view illustrative of novel memory transistor arrays of FIG. 7 taken along the B–B' line.
Figure 9E:
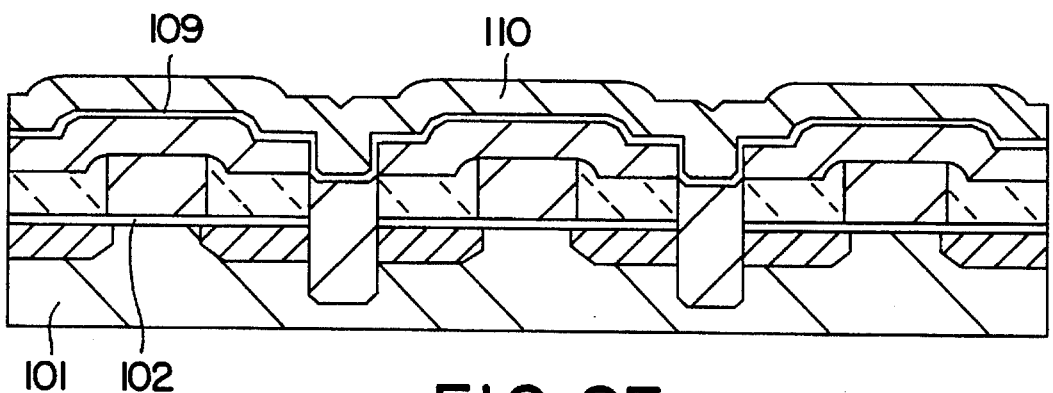

With reference to FIG. 9E, an entire surface of the device is subjected to a thermal oxidation of silicon to form a second gate oxide film 109 having a thickness of 200 angstroms before a polysilicon film doped with an n-type impurity and having a thickness of 3000 angstroms is deposited by a chemical vapor deposition on the second gate oxide film 109. The deposited polysilicon film is subsequently etched by a control gate pattern to form a control gate 110. Further, a p-type impurity is introduced into the device at $1 \times 10^{15}$ ($cm^{-2}$) to form isolation diffusion regions 111 that is illustrated in FIG. 7.

Figure 9F:
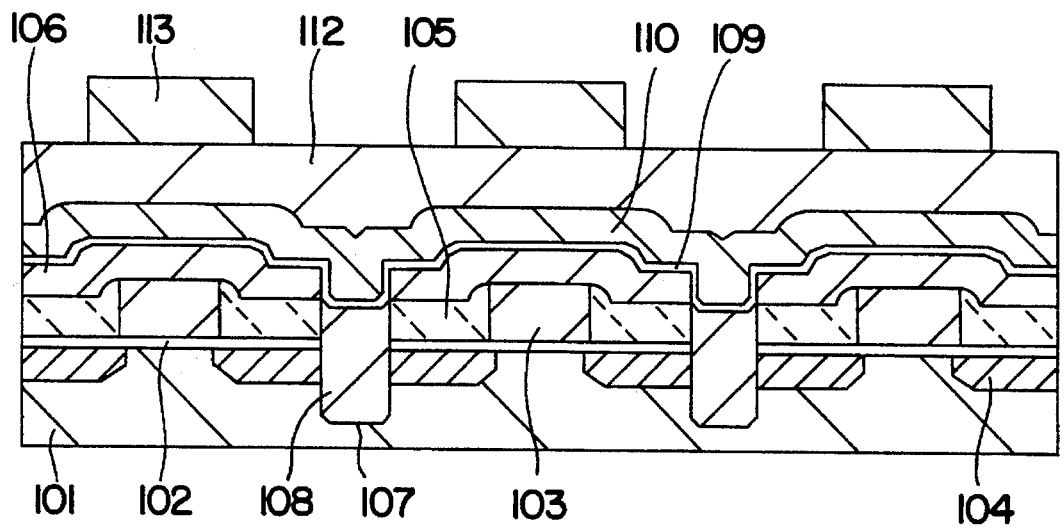

With reference to FIG. 9F, a second inter-layer insulator 112 having a thickness of 5000 angstroms is formed by a chemical vapor deposition on an entire surface of the device, after which contact holes are formed in the second inter-layer insulator 112. Further, metal wirings 113 are formed on the second inter-layer insulator 112.

According to the present invention, the drain and source regions are self-aligned with respect to the first floating gate layer and isolations regions that isolate the memory cell regions on which the memory transistors are formed are also self-aligned but with respect to the second floating gate layer overlying the first floating gate layer. This novel fabrication method is free from the problem with the appearance of the bird's beak, namely free from any enlargement of the isolation region. No enlargement of the isolation region may permit an improvement of the memory transistor arrays in a degree of integration thereof.

Figure 9G:
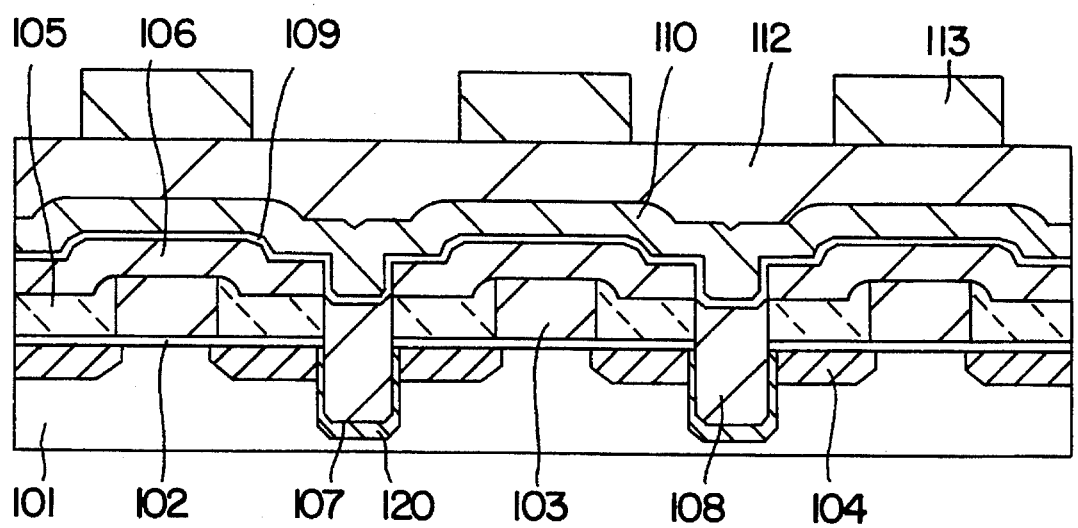
Figure 9H:
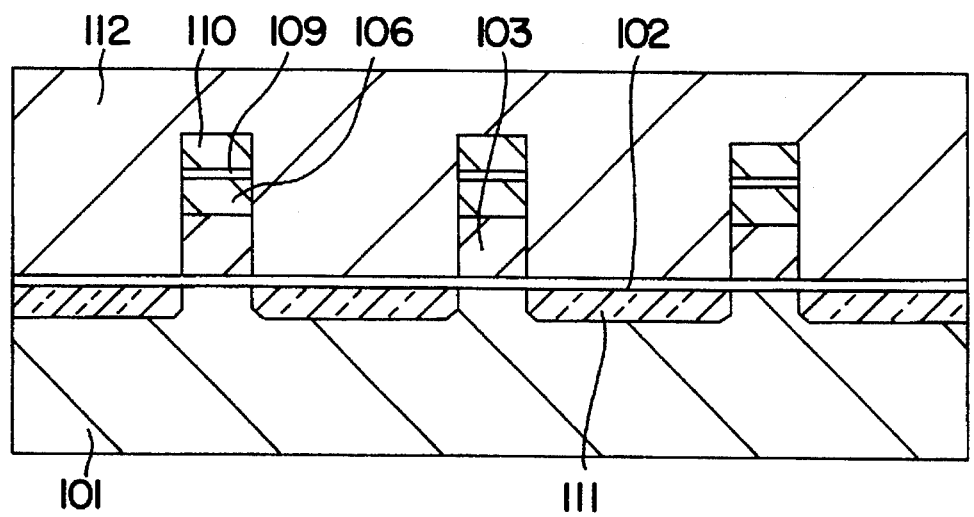

As a modification of the first embodiment according to the present invention, as illustrated in FIGS. 9G and 9H, it is available to form an isolation trench groove impurity region to surround the trench isolation. In this case, immediately after forming the trench groove by etching with use of the second floating gate layer as a mask, an impurity having the same conductivity type is introduced within the isolation trench groove 107 for subsequent rotating injection of a p-type impurity at $1 \times 10^{15}$ ($cm^{-2}$) thereby the trench groove impurity region 120 is formed. The trench groove impurity region 120 may improve an ability for isolation of the isolation trench groove. This may prevent any small leakage current flow between adjacent two memory transistor regions. This may further permit a fine structure of the trench isolation defined by a limitation provided by photo lithography.

Whereas modifications of the present invention will no double be apparent to a person having ordinary skill in the art, to which the invention pertains, it is to be understood that the embodiments shown and described by way of illustrations are by no means intended to be considered in a limiting sense. Accordingly, it is to be intended to cover by claims any modifications of the present invention which fall within the sprit and scope of the invention.

What is claimed is:

1. A method for fabricating a semiconductor memory device having a double layered floating gate, said method comprising the steps of:

forming a single floating gate oxide film having an uniform thickness on an entire surface of a semiconductor substrate of a first conductivity type;

selectively forming a first floating gate made of a polysilicon film on an area of said single floating gate oxide film;

selectively forming diffusion regions by implanting a dopant of a second conductivity type into the surface of said semiconductor substrate through said single floating gate oxide film using said first floating gate as a mask;

selectively forming an interlayer insulator on said single floating gate oxide film over said diffusion regions, said interlayer insulator having a thickness nearly equal to a thickness of said first floating gate electrode so that an upper surface of said interlayer insulator is substantially level with an upper surface of said first floating gate electrode;

selectively forming a second floating gate electrode both on said first floating gate electrode and on a portion, in a vicinity of said first floating gate, of said interlayer insulator, said second floating gate electrode having a larger width than the width of said first floating gate electrode;

forming trench grooves by selective etching of said interlayer insulator, said gate oxide film, said diffusion region and an upper region of said semiconductor substrate, using said second floating gate electrode as a mask;

filling said trench grooves with an insulating material to form trench isolation wherein an upper surface of said insulating material is substantially level with the upper surface of said inter layer insulator;

forming a control gate oxide film on an entire surface of said resulting structure after the trench grooves are filled to thereby have said control gate oxide film cover the upper surface and sidewalls of said second floating gate electrode and said upper surface of said insulating material within said trench groove; and forming a control gate electrode of polysilicon on an entire surface of said control gate oxide film so that all parts of said control gate oxide film except on said insulating material within said trench groove are sandwiched between said second floating gate electrode and said control gate electrode.

2. The method as claimed in claim 1, wherein said floating gate oxide film comprises silicon oxide film formed by a thermal oxidation of silicon to have a thickness of about 100 angstroms so as to facilitate a tunneling of electrons from said first floating gate electrode into one of said diffusion regions through said floating gate oxide film for a memory erasing operation.

3. The method as claimed in claim 2, wherein said first floating gate electrode comprises a polysilicon film having a thickness of about 4000 angstroms.

4. The method as claimed in claim 3, wherein said inter-layer insulator is formed by the steps of:

depositing a silicon dioxide film having a thickness of about 8000 angstroms by a chemical vapor deposition to have said silicon dioxide film cover said floating gate oxide film and said first floating gate electrode; and subjecting said deposited silicon dioxide film to etchback so that said upper surface of said first floating gate electrode is exposed and the upper surface of said silicon dioxide film has the same level as said upper surface of said first floating gate electrode.

5. The method as claimed in claim 4, further comprising the step of:

forming an additional inter-layer insulator made of borophosphosilicate glass having a thickness of about 5000 angstroms by a chemical vapor deposition;

forming a contact hole in said additional interlayer insulator to be positioned over said second floating gate electrode to have an upper surface of said second floating gate electrode partially exposed through said contact hole; and selectively forming metal films acting as interconnections so as to make contact with said second floating gate electrode through said contact hole.

* * * * *